(12) United States Patent
Griffel et al.

(10) Patent No.: US 6,639,930 B2
(45) Date of Patent: Oct. 28, 2003

(54) MULTI-LEVEL CLOSED LOOP RESONATORS AND METHOD FOR FABRICATING SAME

(75) Inventors: Giora Griffel, Tenafly, NJ (US); Raymond J. Menna, Newtown, PA (US); Joseph H. Abeles, East Brunswick, NJ (US); John C. Connolly, Clarksburg, NJ (US)

(73) Assignee: Princeton, Lightwave, Inc., Cranbury, NJ (US)

( * ) Notice: Subject to any disclaimer, the term of this patent is extended or adjusted under 35 U.S.C. 154(b) by 0 days.

(21) Appl. No.: 10/043,548

(22) Filed: Jan. 11, 2002

(65) Prior Publication Data

US 2002/0154674 A1 Oct. 24, 2002

Related U.S. Application Data

(60) Provisional application No. 60/260,941, filed on Jan. 11, 2001.

(51) Int. Cl.$^7$ ............................................. H01S 3/083
(52) U.S. Cl. ................................................ 372/94; 372/92
(58) Field of Search ........................................ 372/92, 94

(56) References Cited

U.S. PATENT DOCUMENTS 5,239,598 A  *  8/1993  Wight et al. .................... 385/8
6,009,115 A  * 12/1999  Ho et al. ........................ 372/92

* cited by examiner

*Primary Examiner*—Paul Ip
*Assistant Examiner*—James Menefee
(74) *Attorney, Agent, or Firm*—Duane Morris LLP

(57) ABSTRACT

A closed-loop ring resonator including a closed loop formed on a substrate and including at least one coupling region having a first effective depth and at least one other region having a second effective depth, wherein the first and second depths are different.

15 Claims, 5 Drawing Sheets

MULTI-LEVEL CLOSED LOOP RESONATORS AND METHOD FOR FABRICATING SAME

CROSS-REFERENCE TO RELATED APPLICATION(S)

This application claims the benefit of U.S. Provisional Application Serial No. 60/260,941 filed on Jan. 11, 2001.

GOVERNMENT INTEREST

This work was supported in part by the Air Force Rome Labs under Grant SBIR F-30602-97 and in part by the National Science Foundation (NSF) under GrantECS-9634617. The government may have certain rights in this invention

FIELD OF THE INVENTION

The present invention relates to closed-loop ring resonators and methods for fabricating the same.

BACKGROUND OF THE INVENTION

Evanescently coupled closed-loop ring resonators in general, and Racetrack Ring Resonators ($R^3$s) or elongated loops in particular, offer several interesting features for applications such as Dense Wavelength Division Multiplexing (DWDM) and RF photonics. Lacking reflectors, fabrication of the same is generally free of lapping, cleaving, facet etching and coating, or of concerns arising from high mirror power density. Spectral characteristics of the same can be conventionally determined using well known photolithography techniques, and single wavelength operation can be achieved without gratings. When combined with other components small diameter low loss passive and active ring resonators, on the order of <200 $\mu$m, enable the fabrication of sophisticated photonic integrated circuits that take full advantage of two-dimensional (2-D) chip layouts. With the development of robust fabrication methods, such photonic circuits may include composite linking and switching systems, local oscillator distribution, and true-delay signal distribution at wavelengths of 1.3 and 1.55 $\mu$m to name a few.

Previous efforts have been carried out to demonstrate $R^3$ Lasers ($R^3$Ls) in both AlGaAs and InGaAsP material systems and using different coupling schemes. Undesirably, conventional, shallow-etched Ridge-WaveGuide (RWG) circular structures are limited to large diameters, on the order of $\langle \geq 300 \, \mu$m, due to excessive bending loss. The low index difference between the guiding channel core and its surrounding of RWG structures causes a significant evanescent portion of a guided mode, which cannot propagate at group velocities exceeding $$c/n_{\textit{eff}}$$

where c is the speed of light in vacuum and $n_{\textit{eff}}$ the effective refractive index of the mode to radiate. Even for large-diameter shallow-etched structures, significant bending loss is evidenced by large threshold currents ranging from 106 to 150 mA.

Coupling into deeply etched laser structures has been achieved by using either Y-junction or MultiMode Interference (MMI) couplers. In spite of the reduced bending loss, deeply etched $R^3$Ls have also demonstrated large threshold current values, in excess of 170 mA. Vertical walls etched through an epitaxial waveguide have also been used in small diameter passive ring structures, on the order of $\leq 10 \, \mu$m, to allow negligible waveguide bending and scattering loss. However, strong confinement caused by deep etching undesirably requires sub-micrometer lateral separation between the ring and coupled waveguides to achieve adequate coupling and requires fabrication tolerances of −10/+20 nm. Furthermore, when used as a highly transmissive filter, coupling coefficients in and out of the ring resonator must be nearly identical, undesirably tightening fabrication constraints even further. Reliance on sub-micrometer features and tolerances entails significant impediments to achieving a robust manufacture-able technology that lends itself to large-scale integration and mass productive of ring resonator based photonic circuits.

It is an object of the present invention to overcome these prior art limitations and provide an improved closed-loop ring resonator and method for manufacturing the same.

SUMMARY OF INVENTION

A closed-loop ring resonator including a closed loop formed on a substrate and including at least one coupling region having a first effective depth and at least one other region having a second effective depth, wherein the first and second depths are different.

BRIEF DESCRIPTION OF THE FIGURES

Various other objects, features and advantages of the invention will become more apparent by reading the following detailed description of the invention in conjunction with the drawings, which are shown by way of example only, wherein.

DETAILED DESCRIPTION OF THE PREFERRED EMBODIMENT

Figure 1:
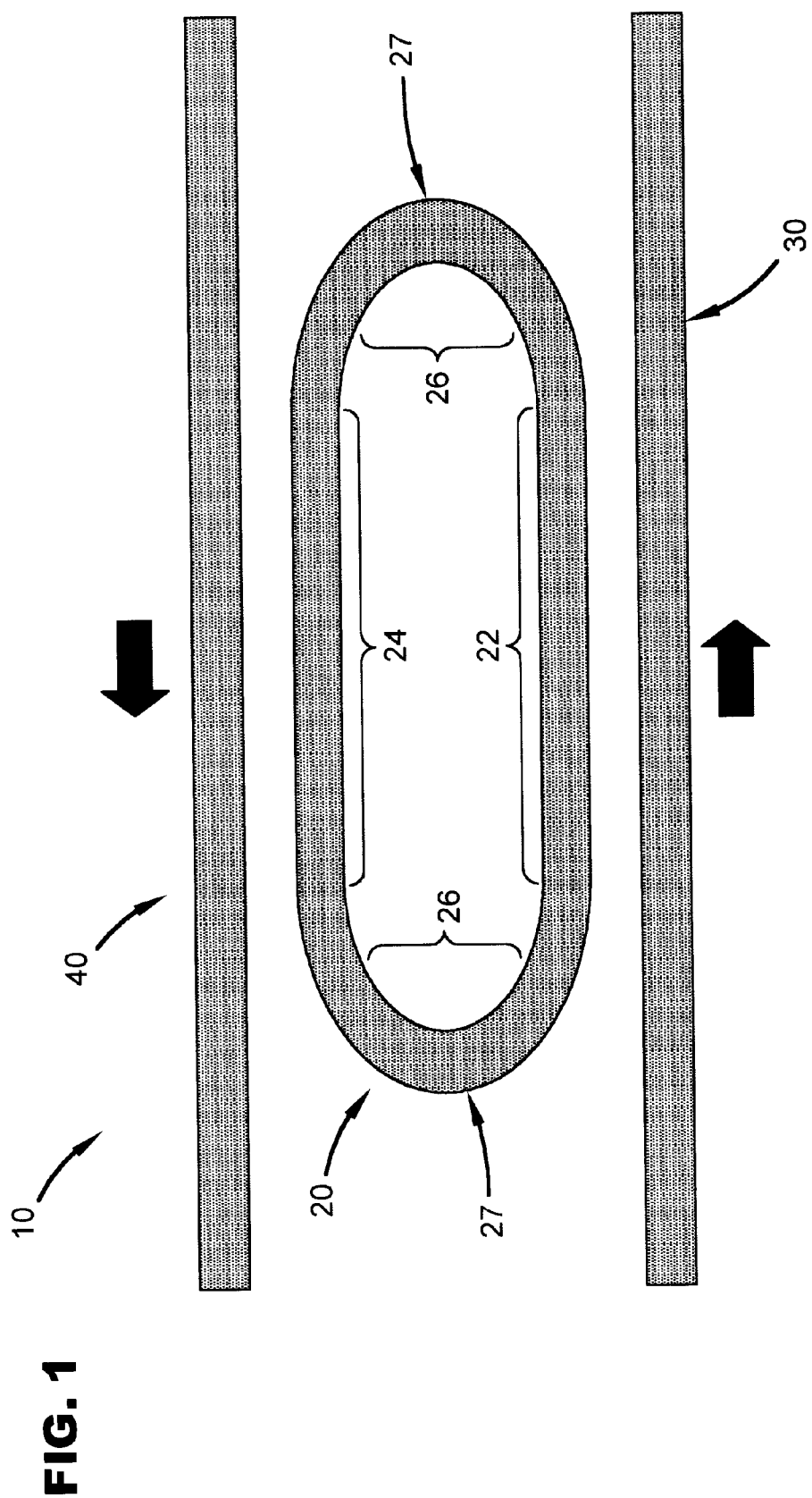
FIG. 1 illustrates a top-view of a Racetrack Ring Resonator ($R^3$)

A design for closed-loop ring resonator coupling that uses conventional photolithography and exhibits improved control over coupling strength is presented. The present invention will be described as it relates to an InGaAsP ring resonator waveguide in the form of a Racetrack Ring Resonator ($R^3$) placed between two straight input/output waveguides as shown in FIG. 1. It should be clearly understood that the present invention is equally applicable to other closed-loop shapes, as well as other types of devices, such as passive devices including filters for example. Referring still to FIG. 1, therein is illustrated a portion of an $R^3$ configuration 10 according to one aspect of the present invention. The configuration 10 includes a closed loop 20 and waveguides 30, 40. Waveguides 30, 40 are evanescently coupled to the closed loop 20 using coupling portions 22, 24 of the closed-loop 20, respectively. Such a configuration is suitable for photonics switching and signal processing as well. Referring still to FIG. 1, the closed-loop 20 illustrated therein takes the form of an elongated ring, or racetrack. Curved portions 26 of the closed-loop 20 interconnect coupling regions 22, 24.

According to an aspect of the present invention, deep etching is utilized to advantageously reduce bending loss at the curved sections 26, but is avoided at the gap between the straight sections of the loop 20 and the input/output waveguides, i.e. the coupling regions 22, 24, where it may interfere with coupling into and out of the waveguides 30, 40. There, a shallower etch which defines the coupling regions 22, 24 is halted before removing the epitaxial waveguiding layers according to another aspect of the present invention. This multi-level etching technique is essentially a modification of the MMI method that provides better control of the coupling in deeply etched structures where, due to the large index contrast, a large number of modes participate in the interaction. It is important to note that although a straight section of the deeply etched waveguide can support higher-order lateral modes, the curved sections of the loop 20, i.e. the curved portions 26, whose first-order lateral mode cutoff radius is 250 $\mu$m, discriminate in favor of single lateral mode operation. Moreover, the depth of etching in the coupling region determines whether that region is a directional coupler, having only two lateral modes participating in the coupling, or a modified MMI coupler where more than two lateral modes determine the power splitting.

The issues of coupling strength and coupling efficiency are of utmost importance to the performance of $R^3Ls$, like many other optical devices. They not only affect power extraction efficiency, but introduce intracavity loss that, in laser structures, increases the threshold current. The electromagnetic field transmitted from the input 30 to the output 40 coupling waveguide of FIG. 1 through the resonator 20, is given by $$\frac{E_o}{E_i} = \frac{t_1 t_2 \exp[-i(\beta_a L_c + 2\beta_c L_c)]}{1 - r_1 r_2 \exp[-i2(\beta_a L_a + 2\beta_c L_c)]}$$

where $t_{1,\,2}$ are the coupling coefficients of the upper and lower coupling regions 22, 24 respectively, $\beta_{a,\,c}$ are the propagation constants in the curved sections 26 and straight sections 22, 24 of the closed loop 20, respectively, $L_a$ is the total length of the curved sections 26, a is the radius of the ring, and $L_c$ the length of each straight section 22, 24. $r_{1,\,2}$ represent the fraction of incident field which is not transmitted from one waveguide to the other 30, 40 in the coupling region 22, 24, where it can be shown, using the coupled-mode formalism and power conservation, that $/r_{1,\,2}/^2 + /t_{1,\,2}/^2 = 1$.

This transmission function reveals that a ring resonator such as 10 is analogous to a Fabry-Perot (FP) resonator. That is, at zero gain the spectrum is characterized by Lorentzian-like transmission peaks at resonance with a free spectral range (FSR) of $$\frac{c}{n_{\mathit{eff}}^a L_a + 2 n_{\mathit{eff}}^c L_c}.$$

The couplers play a role analogous to FP mirrors. To obtain unity transmission at resonance with zero gain the coupling coefficients should be equal, i.e., $t_1 = t_2$, which for the case of deeply etched structure predicates extremely tight fabrication constraints.

Figure 2:
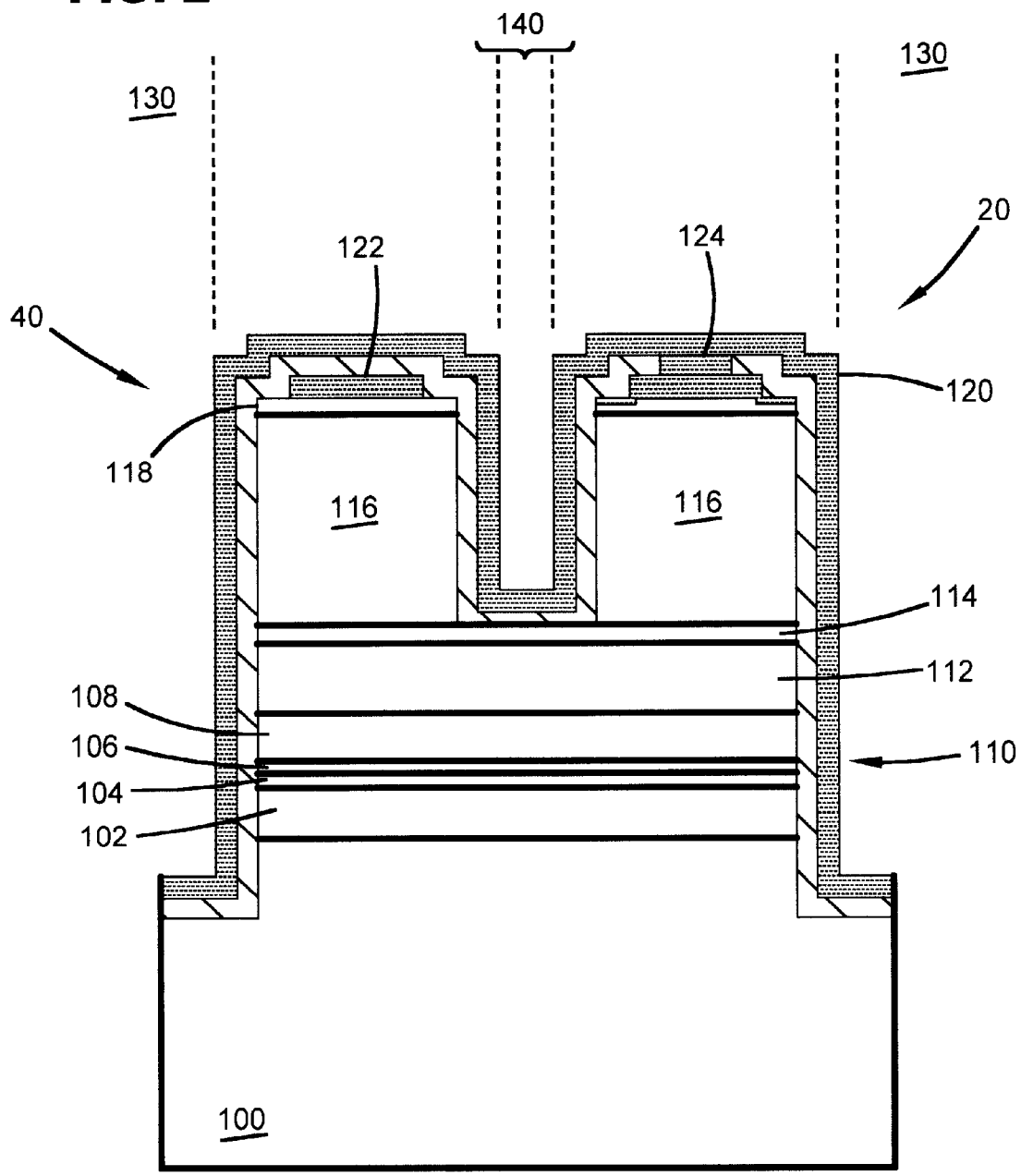
FIG. 2 illustrates a schematic cross-section diagram of a closed loop Racetrack Ring Resonator laser ($R^3$L) taken at the coupling region between the ring and a waveguide section according to one aspect of the present invention.

Referring now also to FIG. 2, there is shown a schematic cross-section diagram of the configuration 10 taken at the coupling region between the ring 20 and a waveguide section 30, 40 according to one aspect of the present invention. The structure of FIG. 2 generally includes a substrate 100, formed of InP for example. Upon the substrate 100 is formed a waveguide and quantum wells 110 including layer 102 and 108 which comprise the core of the waveguide. Both layers 102 and 108 have a higher refractive index than their surrounding surface of the device and the shoulder 106. Layer 118 is the cap layer fabricated from a highly conductive p+ material. Numeral 104 references an area of the layer where quantum wells are located. A typical quantum well can be conventionally 70 Å-100 Å thick. Areas 112 and 116 are of the same material and function as the cladding layer of the optical waveguide and are both the p or n side of the formed diode junction. These areas have a lower refractive index than the core areas. Layer 114 could be placed anywhere between the top 118 surface of the device and the shoulder 106. Layer 118 is the cap layer fabricated from a highly conductive p+ material.

Still referring to FIG. 2, multiple etched levels 130, 140 are shown, in the particular case of FIG. 2, 2 levels are shown. This is referred to herein as "bi-level" etching. Of course, additional levels can be formed. The etched level designated 130 defines the waveguides 30,40 and closed loop 20 in general. The etched level designated 140 defines the coupling region between the waveguides 30, 40 and the closed loop 20. The depth of the etched levels 130, 140 is different. This defines the bi-level etching. It should be understood that the deeper etched level 130 is described herein for purposes of more deeply defining an outer wall 27 of the curved regions or portion 26 of the closed loop 20, as that is where most losses due to bending occur (FIG. 1). Of course, other particular configurations which effectively increase the depth of the outer walls 27 can be used to accomplish the same results. That is, deep etching is required mainly along and in the vicinity of the outer wall of the curved section of the ring resonator, whereas shallower etching levels can be prescribed to other regions of the device including, but not limited to the coupling region between the straight sections of the $R^3$ and the input/output waveguides.

It should also be noted that in the case illustrated by FIG. 2, the etched level 140 does not enter the waveguide 110, that is it stops short of reaching thereinto. This results in a multimode waveguide. If the etched level 140 is extended into the waveguide 110 a 2-mode directional coupler can be advantageously achieved.

Still referring to FIG. 2, the Organo-Metallic Chemical Vapor Deposition (OMCVD)-grown epistructure shown therein includes three compressively strained InGaAsP quantum wells imbedded in a 70-nm waveguide structure of two compositions with bandgap energy $E_g$=1.13 and 1.00 eV. Cladding layers are InP. The fabrication involves several steps not normally used in conjunction with conventional RWG laser processing. These include: 1) liftoff metal deposition of closely spaced lines and 2) both shallow and deep etching with no feature undercutting. For the coupling channel between parallel waveguides as is illustrated in FIG. 2, an asymmetric structure is fabricated. The waveguiding geometry is first defined by $H_2/CH_4$ reactive ion etching (RIE), timed to remove the p-type cladding layer and reveal the upper surface of the waveguide structure. Next, the coupling region is coated with a second dielectric layer. Smooth side-walls extending through the waveguide structure are etched, except in the coupling region protected by the second dielectric layer.

A bend radius of 150 $\mu$m is combined with four different coupler lengths of 50, 100, 150, and 200 $\mu$m, positioned at the center of the straight section of the racetrack, which is 50 µm longer. The width of ridges throughout the structure is 2.5 µm and the gap between resonator and coupling waveguides is 2 µm. The coupling waveguides, which extend beyond the racetrack ring resonator, are cleaved, and output facets optically coated to ≈3% reflectivity. FIG. 1 illustrates a top-view showing the racetrack resonator and the straight coupling waveguides. Biasing electrodes are provided separately for the ring resonator 10 and the portion of each of the two coupling waveguides 20, 30 extending from the resonator 10 to the autoregressive-coated facet. The latter are biased approximately to transparency to facilitate laser characterization. The remaining portion of the coupling waveguides 20, 30 extending toward the rear facet are bent and flared to cut down the effective reflectivity from the unused facet. These sections can be also reverse-biased to further reduce parasitic reflectivity.

Figure 3:
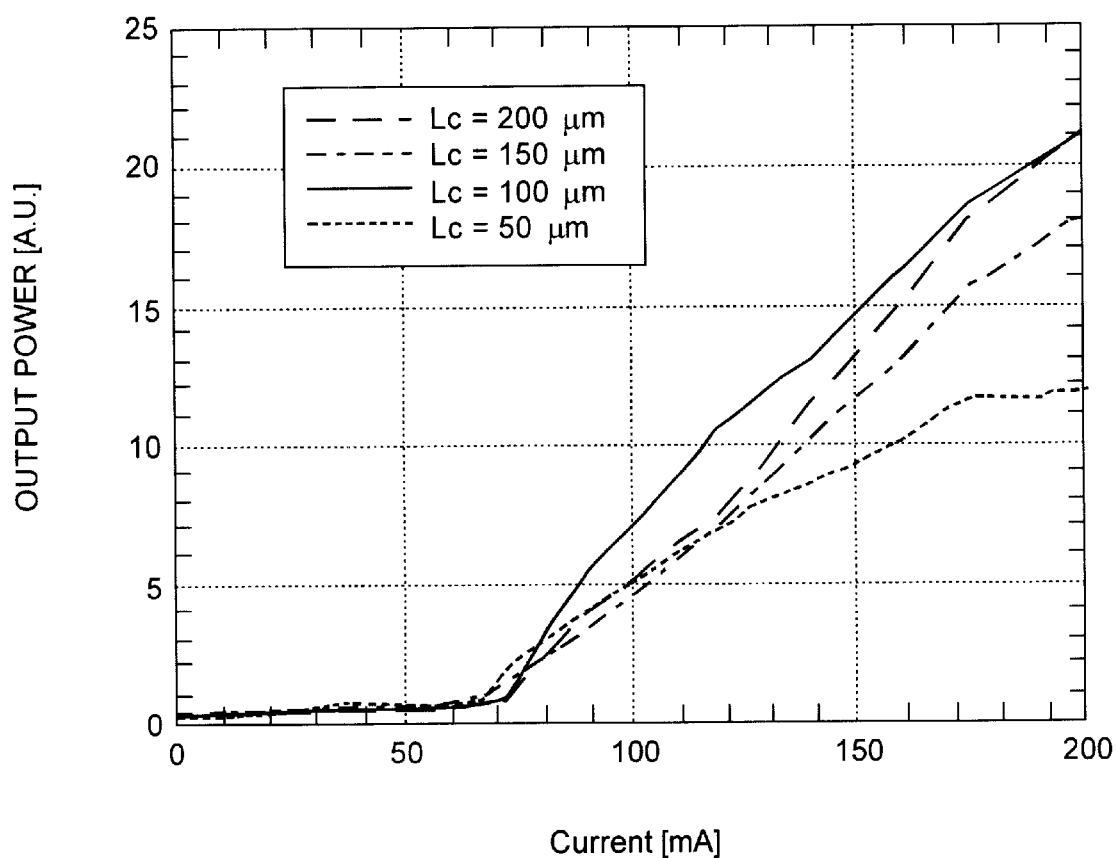
FIG. 3 illustrates an output power characteristic of $R^3$L's with coupling lengths ranging from 50 to 200 $\mu$m.

Continuous-wave (CW) room-temperature relative L-I characteristics of devices having all four $L_c$ values are shown in FIG. 3. These indicate threshold currents varying from 66 mA for the 50 and 150 µm coupling region devices to 72 mA for the 100 and 200 µm devices. These threshold currents are more than a factor of two lower than the lowest-threshold InP ring lasers previously reported. It is believed that this dramatically improved threshold performance is attributable to the multi-level, in the illustrated case bi-level, etched $R^3L$ design. The corresponding threshold current densities range between 2.145 kA/cm² for the 200-µm coupler to 2.53 kA/cm² for the 50-µm coupler. These values are within a factor of two to three of threshold current densities of world-record RWG FP lasers with similar dimensions and fabricated from similar material. Changing the bias level of the straight coupling waveguides has a negligible effect on the threshold current.

The small dependence of the threshold current on the coupling length indicates that the loss in the cavity is governed mostly by mechanisms other than the output coupling, such as scattering due to wall roughness, bending loss, or modal transition from the curved to the straight section and from the deeply etched to the shallow etched transition regions. Passive measurements of the devices were taken at longer wavelength using temperature tuned InGaAsP DFB laser operating at 1.655–1.659 µm. Depth of modulation of about 20% was observed with finesse of 2.5. Coupling efficiency of 20% and effective distributed loss, combining bending, mode matching and scattering loss, of 15.1 [cm$^{-1}$] were calculated.

Figure 4:
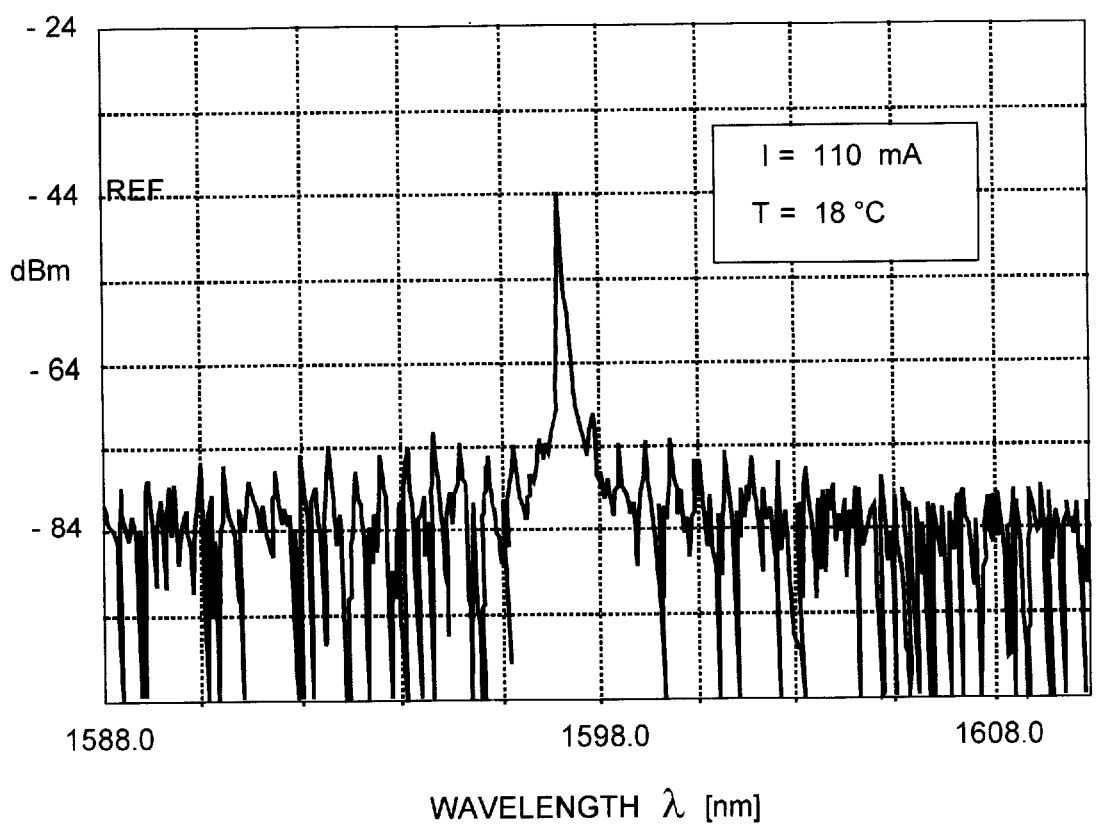
FIG. 4 illustrates a lasing spectra of a $R^3$L at a drive current I=110 mA, showing single mode operation; and, FIG. 5 illustrates a lasing spectra of a $R^3$L at a drive current I=140 mA, showing a nonlinear change to a broad spectrum.
Figure 5:
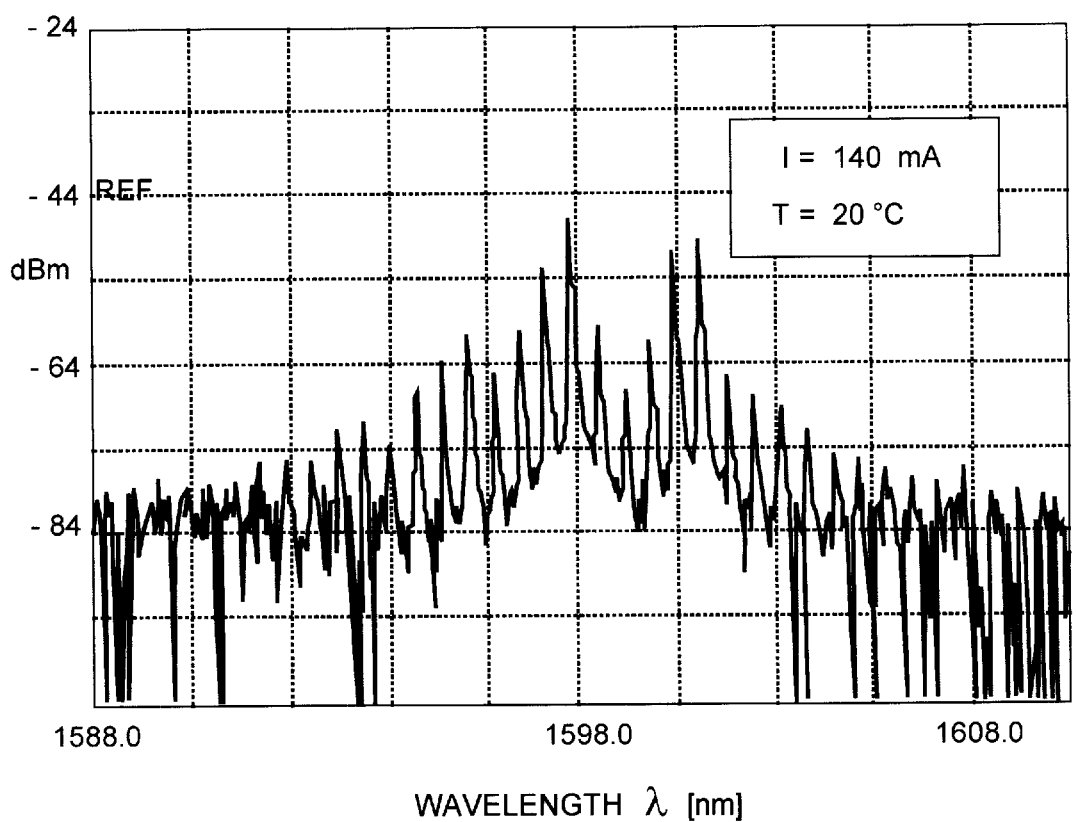

The CW spectrum of an $R^3L$ with 100-µm-long couplers is shown in FIG. 4. It exhibits single longitudinal mode operation with a side-mode suppression ration better than 26 dB. Many ring laser modes are clearly visible as noise peaks below that level. Single mode lasing is obtained up to nearly twice threshold. As shown in FIG. 5, at 140 mA, the spectrum abruptly changes to a broad spectrum of the same ring laser modes, suggestive of passively mode locked self pulsation. The separation of these modes was observed to match and scale inversely with the circumference of the racetrack 20.

In other words, the present discussion presents an InGaAsP closed-loop ring resonator device, such as an $R^3L$ laser employing a novel multi-level etched structure, such as a bi-level etched structure, which can be defined by conventional photolithography and incorporates low-loss curved waveguides and lateral couplers. In the particular case of the illustrated $R^3L$, it exhibits a threshold current of 66 mA, which is the lowest value of any InP ring resonator laser reported to date. It operates in a single mode to nearly twice the threshold with a 26-dB side-mode suppression ratio. This novel fabrication technique can be also be applied to the construction of passive ring resonators devices such as filters, modulators, routers, and detectors, for example.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

What is claimed is:

1. A closed-loop ring resonator comprising:
    a closed loop ring formed on a substrate defined by grooves within said substrate, said ring comprising:
        at least one coupling region having a first effective depth; and
        at least one non-coupling region having a second effective depth operative to reduce bending loss, said first and second effective depths being the depths of said grooves defining said resonator wherein said first effective depth is shallower than said second effective depth.

2. The resonator of claim 1, further comprising
    at least one waveguide formed within a given proximity of said coupling region.

3. The resonator according to claim 1 wherein the substrate is formed from InP.

4. The resonator according to claim 1, further including a first waveguide located on said substrate and positioned to enable coupling of a signal propagating in said first waveguide to said resonator.

5. The resonator according to claim 4 further comprising a second waveguide located on said substrate at a position opposite to said first waveguide and positioned to enable coupling of a signal propagating in said resonator to said second waveguide.

6. The resonator according to claim 5 wherein said waveguides are cleaved having output facets.

7. The resonator according to claim 5 wherein said first and second waveguides are evanescently coupled to said resonator.

8. The resonator according to claim 7 wherein said first and second waveguides are linear waveguides parallel to one another and each positioned at an opposite side of said closed loop resonator.

9. The resonator according to claim 1 wherein said resonator is a multi level etched structure.

10. The resonator of claim 1 wherein the resonator is a racetrack ring resonator.

11. A method for fabricating a closed loop resonator, comprising the steps of:
    forming a waveguide on a substrate,
    forming quantum wells including a first and a second layer on said substrate to form a waveguide core,
    forming additional layers on said first and second layers,
    forming a cladding layer on said substrate, etching said substrate to define a first waveguide structure with another etch not extending into the waveguide region defining a resonator, whereby etched depth levels of said other etch is different than the depth level of said waveguide structure to increase coupling between signals from said waveguide to said another etch region.

12. The method according to claim 11 wherein said substrate is formed of InP.

13. The method according to claim 11 wherein said quantum wells are between 70 to 100 Angstroms thick.

14. The method according to claim 13, wherein said first and second layers are P+layers.

15. The method according to claim 13 wherein said quantum wells are compressively strained InGaAsP quantum wells.

* * * * *